United States Patent
Joseph et al.

(10) Patent No.: US 8,426,967 B2
(45) Date of Patent: Apr. 23, 2013

(54) SCALED-DOWN PHASE CHANGE MEMORY CELL IN RECESSED HEATER

(75) Inventors: Eric Andrew Joseph, White Plains, NY (US); Chung Hon Lam, Peekskill, NY (US); Alejandro Gabriel Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 1371 days.

(21) Appl. No.: 11/620,138

(22) Filed: Jan. 5, 2007

(65) Prior Publication Data

US 2008/0164452 A1   Jul. 10, 2008

(51) Int. Cl.
| | |
|---|---|
| *H01L 23/48* | (2006.01) |
| *H01L 23/52* | (2006.01) |
| *H01L 29/40* | (2006.01) |
| *H01L 21/06* | (2006.01) |

(52) U.S. Cl.
USPC .............. 257/758; 257/E21.577; 438/102

(58) Field of Classification Search .......... 257/758, 257/E21.577; 438/102
See application file for complete search history.

(56) References Cited

U.S. PATENT DOCUMENTS

| | | | | |
|---|---|---|---|---|
| 5,933,365 | A * | 8/1999 | Klersy et al. ............... | 365/148 |
| 2003/0071289 | A1* | 4/2003 | Hudgens et al. ............ | 257/246 |
| 2004/0012009 | A1* | 1/2004 | Casagrande et al. ........ | 257/4 |
| 2004/0087074 | A1* | 5/2004 | Hwang et al. ............... | 438/198 |
| 2004/0109351 | A1* | 6/2004 | Morimoto et al. .......... | 365/171 |
| 2004/0115372 | A1* | 6/2004 | Lowrey ....................... | 428/34.1 |
| 2004/0195604 | A1* | 10/2004 | Hwang et al. ............... | 257/295 |
| 2005/0006681 | A1* | 1/2005 | Okuno ......................... | 257/295 |
| 2005/0110983 | A1* | 5/2005 | Jeong et al. ................. | 356/148 |
| 2005/0122271 | A1* | 6/2005 | Pecora et al. ............... | 343/719 |
| 2005/0152208 | A1* | 7/2005 | Bez et al. .................... | 365/232 |
| 2005/0227496 | A1* | 10/2005 | Park et al. ................... | 438/745 |
| 2005/0263829 | A1* | 12/2005 | Song et al. .................. | 257/379 |
| 2006/0011902 | A1* | 1/2006 | Song et al. .................. | 257/4 |
| 2006/0030108 | A1* | 2/2006 | Cho et al. ................... | 438/281 |
| 2006/0040485 | A1* | 2/2006 | Lee et al. .................... | 438/597 |
| 2006/0211231 | A1* | 9/2006 | Asano et al. ................ | 438/593 |
| 2007/0045606 | A1* | 3/2007 | Magistretti et al. ......... | 257/4 |
| 2007/0096162 | A1* | 5/2007 | Happ et al. .................. | 257/246 |
| 2007/0257300 | A1* | 11/2007 | Ho et al. ..................... | 257/315 |
| 2008/0055969 | A1* | 3/2008 | Liu ............................. | 365/163 |
| 2008/0116441 | A1* | 5/2008 | Raghuram et al. .......... | 257/4 |
| 2008/0119007 | A1* | 5/2008 | Raghuram et al. .......... | 438/99 |

* cited by examiner

*Primary Examiner* — Robert J Hoffberg
*Assistant Examiner* — Igwe U Anya
(74) *Attorney, Agent, or Firm* — Vazken Alexanian; Ryan, Mason & Lewis, LLP (57) ABSTRACT

A semiconductor structure configurable for use as a nonvolatile storage element includes a first electrode, an insulating layer formed on at least a portion of an upper surface of the first electrode, and a pillar traversing the insulating layer and being recessed relative to an upper surface of the insulating layer. The pillar includes a heater formed on at least a portion of the upper surface of the first electrode and a collar formed on sidewalls of the insulating layer proximate the heater and on at least a portion of an upper surface of the heater. The structure further includes a PCM layer formed on at least a portion of the upper surface of the insulating layer and substantially filling a volume defined by the upper surface of the heater and at least a portion of an upper surface of the collar. A second electrode is formed on at least a portion of an upper surface of the phase change material layer.

13 Claims, 6 Drawing Sheets

SCALED-DOWN PHASE CHANGE MEMORY CELL IN RECESSED HEATER

FIELD OF THE INVENTION

The present invention relates generally to memory devices, and more particularly relates to phase change memory cells.

BACKGROUND OF THE INVENTION

Non-volatile memory is an integral part of many electronic devices from mobile phones, digital cameras, and set-top boxes, to automotive engine controllers primarily because of its ability to store data even when power is turned off. One type of non-volatile memory, namely, phase change (PC) memory, is aimed at eventually supplanting flash memory technology which is used abundantly in such electronic devices. Modern phase change random access memory (PRAM) typically requires that a PC memory cell employed therein be compatible with existing field-effect transistor (FET) technology. However, PC memory cell volume must be very small so as to ensure that set and reset currents in the PC memory cell are smaller then a maximum FET current, which is difficult to achieve using present complementary metal-oxide semiconductor (CMOS) fabrication technology, such as, for example, a 90 nanometer (nm) process.

As is known, PC memory cells are generally based on storage elements which utilize a class of materials, such as chalcogenides, that have the property of switching between two distinct states, the electrical resistance of which varies according to the crystallographic structure of the material. A high-resistance, reset state is obtained when an active region of the phase change material (PCM) is in an amorphous phase, whereas a low-resistance, set state is obtained when the PCM is in a crystalline or polycrystalline phase. The PCM can be selectively switched between the two phases by application of set and reset currents to the PC memory cell.

Reducing the amount of current required by a PCM layer to change its crystalline phase can beneficially decrease power dissipation and improve reliability during operation of the PC memory cell. Consequently, attempts have been made to define current flow in the PC memory cell so as to provide more efficient self-heating (e.g., Joule heating) of the PCM in the cell. Existing solutions for defining current flow in a PC memory cell, which in turn defines an active PC memory cell volume, rely predominantly on pushing lithography and etching capabilities to their limits. Presently, existing lithography, including, for example, deep ultraviolet (DUV), e-beam, etc., is limited to a line resolution of about 45 nm. Such lithography techniques are already challenging, especially when forming small features having an island shape (preferably circular).

In particular, one of the smallest elements in a conventional PC memory cell is a heater which is typically located on one side of the PCM. The small heater is often ineffective and challenging to manufacture, and thus adds significantly to the cost of the PC memory cell. In order to achieve satisfactory results using small set/reset currents, the heater in the PC memory cell needs to be localized well inside the PCM. Moreover, a common failure mechanism in PC memory cells results from an open circuit condition due primarily to repeated stress associated with a set/reset operation, and therefore it is even more desirable to minimize the set/reset currents in the PC memory cell so as to ensure reliability of the cell.

Accordingly, there exists a need for improved techniques for defining current flow in a PC memory cell that does not suffer from one or more of the problems exhibited by conventional PC memory cells.

SUMMARY OF THE INVENTION

The present invention addresses the above-identified need by providing, in illustrative embodiments thereof, a PCM-based memory cell that allow the precise tuning of the switching current pulse. Advantageously, these designs provide high localized switching current density and increased heating efficiency so that a magnitude of the switching current pulse may be beneficially reduced to a value that is compatible with modern integrated circuits.

In accordance with an embodiment of the invention, a semiconductor structure configurable for use as a nonvolatile storage element includes a first electrode, an insulating layer formed on at least a portion of an upper surface of the first electrode, and a pillar traversing the insulating layer and being recessed relative to an upper surface of the insulating layer. The pillar includes a heater formed on at least a portion of the upper surface of the first electrode and a collar formed on sidewalls of the insulating layer proximate the heater and on at least a portion of an upper surface of the heater. The structure further includes a PCM layer formed on at least a portion of the upper surface of the insulating layer and substantially filling a volume defined by the upper surface of the heater and at least a portion of an upper surface of the collar. A second electrode is formed on at least a portion of an upper surface of the phase change material layer. A conductive barrier layer may optionally be formed between the second electrode and the phase change material layer.

Preferably, the collar is configured so as to constrict a flow of current in at least a portion of the phase change material layer proximate the heater to thereby create a region of localized heating in at least a portion of the phase change material layer when a switching current signal is applied between the first and second electrodes. The region of localized heating may be confined to a portion of the phase change material substantially filling the volume defined by the upper surface of the heater and at least a portion of the upper surface of the collar.

In accordance with another aspect of the invention, a memory circuit includes a plurality of nonvolatile memory cells and a plurality of bit lines and word lines operatively coupled to the memory cells for selectively accessing one or more of the memory cells. At least a given one of the memory cells includes a first electrode, an insulating layer formed on at least a portion of an upper surface of the first electrode, and a pillar traversing the insulating layer and being recessed relative to an upper surface of the insulating layer. The pillar includes a heater formed on at least a portion of the upper surface of the first electrode and a collar formed on sidewalls of the insulating layer proximate the heater and on at least a portion of an upper surface of the heater. The structure further includes a PCM layer formed on at least a portion of the upper surface of the insulating layer and substantially filling a volume defined by the upper surface of the heater and at least a portion of an upper surface of the collar. A second electrode is formed on at least a portion of an upper surface of the phase change material layer.

In accordance with another aspect of the invention, a method of forming a semiconductor structure configurable for use as a nonvolatile storage element includes the steps of: forming a first electrode; forming an insulating layer on at least a portion of an upper surface of the first electrode;

forming a pillar traversing the insulating layer and being recessed relative to an upper surface of the insulating layer, the pillar comprising a heater formed on at least a portion of the upper surface of the first electrode and a collar formed on sidewalls of the insulating layer proximate the heater and on at least a portion of an upper surface of the heater; forming a phase change material layer on at least a portion of the upper surface of the insulating layer and substantially filling a volume defined by the upper surface of the heater and at least a portion of an upper surface of the collar; and forming at least a second electrode on at least a portion of an upper surface of the phase change material layer.

These and other objects, features and advantages of the present invention will become apparent from the following detailed description of illustrative embodiments thereof, which is to be read in connection with the accompanying drawings.

DETAILED DESCRIPTION OF THE INVENTION

The present invention will be illustrated herein in conjunction with exemplary memory cells for use in integrated circuits, and methods of forming such memory cells. It should be understood, however, that the invention is not limited to the particular materials, features and processing steps shown and described herein. Rather, modifications to the illustrative embodiments will become apparent to those skilled in the art in view of the teachings herein.

Particularly with respect to processing steps, it is emphasized that the descriptions provided herein are not intended to encompass all of the processing steps which may be required to successfully form a fully functional integrated circuit device. Rather, certain processing steps which are conventionally used in forming integrated circuit devices, such as, for example, wet cleaning and annealing steps, are purposefully not described herein for ease of explanation. However one skilled in the art will readily recognize those processing steps omitted from these generalized descriptions. Additionally, certain processing steps described herein may be considered optional, and thus may be omitted. Details of processing steps used to fabricate such integrated circuit devices may be found in a number of publications, for example, S. Wolf and R. N. Tauber, *Silicon Processing for the VLSI Era, Volume 1*, Lattice Press, 1986 and S. M. Sze, *VLSI Technology, Second Edition*, McGraw-Hill, 1988.

The term "phase-change material" (PCM) as used herein is intended to encompass any material displaying more than one programmable electrical resistance state for use in integrated circuits. It is recognized that this definition may encompass more materials than are customarily included within this term. PCMs as used herein comprise, for example, various chalcogenides and transition metal oxides and include, but are not limited to, doped or undoped GeSb, SbTe, $Ge_2Sb_2Te_5$ (GST), $SrTiO_3$, $BaTiO_3$, $(Sr,Ba)TiO_3$, $SrZrO_3$, $In_2Se_3$, $Ca_2Nb_2O_7$, $(Pr,Ca)MnO_3$, $Ta_2O_5$, $NiO_x$ and $TiO_x$, as well as other suitable materials.

It should be understood that the various layers and/or regions shown in the accompanying figures may not be drawn to scale. Furthermore, one or more semiconductor layers of a type commonly used in such integrated circuit structures may not be explicitly shown in a given figure for economy of description. This does not imply that the semiconductor layers not explicitly shown are omitted in the actual integrated circuit device.

Figure 1:
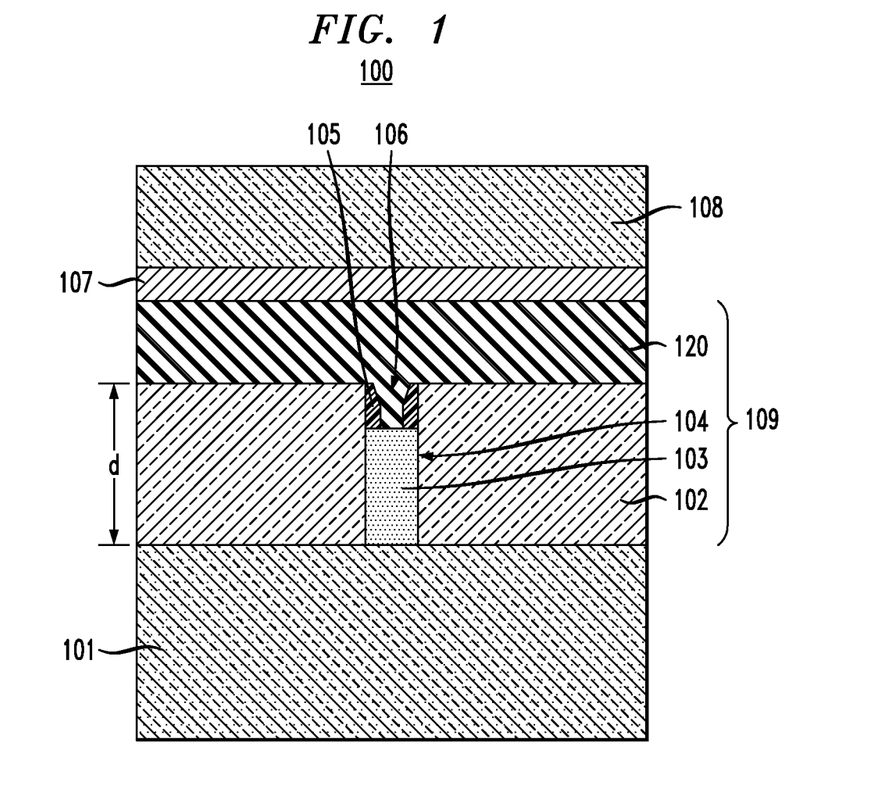
FIG. 1 is a cross-sectional view of a PCM-based memory cell, in accordance with a first illustrative embodiment of the present invention.

FIG. 1 is a cross-sectional view depicting at least a portion of an exemplary memory cell 100, formed in accordance with an illustrative embodiment of the invention. The exemplary memory cell 100 comprises a bottom electrode 101, a top electrode 108, and a PCM-based storage element 109 formed between the top and bottom electrodes. Specifically, storage element 109 preferably comprises an insulating layer 102, which may also be referred to herein as a barrier layer or a dielectric layer, formed on an upper surface of bottom electrode 101, and a PCM layer 120 formed on an upper surface of at least a portion of the insulating layer. An optional conductive barrier layer 107 may be formed on an upper surface of PCM layer 120, between storage element 109 and top electrode 108. Top electrode 10s is formed on an upper surface of conductive barrier layer 107. For embodiments in which conductive barrier layer 107 is omitted from memory cell 100, top electrode 108 may be formed directly on an upper surface of PCM layer 120. It is to be appreciated that, in accordance with other aspects of the invention, memory cell 100 may comprise more or less than two electrode layers, more than one PCM layer, and/or more than one insulating layer.

Bottom and top electrodes 101, 108 provide access to the memory cell 100 essentially by providing electrical connection to storage element 109 therein. The bottom and top electrodes 101, 108 are preferably formed of an electrically conductive material, such as, but not limited to, a metal, an alloy, a metal oxynitride, a conductive carbon compound, etc. For example, top and bottom electrodes 108 and 101, respectively, may comprise aluminum (Al), copper (Cu), tungsten (W), titanium (Ti), tantalum (Ta), titanium nitride (TiN), tantalum nitride (TaN), molybdenum (Mo), niobium (Nb), WN, MoN, NbN, TiSiN, TiAlN, MoAlN, TaSiN, TaAlN, TiW, TaSi, and/or TiSi. The two electrodes 101, 108 need not be formed of the same material. In a preferred embodiment, bottom electrode 101 is comprised of tungsten and top electrode 108 is comprised of copper.

As previously stated, PCM layer 120 is preferably comprised of, for example, various chalcogenides and/or transition metal oxides including, but are not limited to, doped or undoped GeSb, SbTe, $Ge_2Sb_2Te_5$ (GST), $SrTiO_3$, $BaTiO_3$, $(Sr,Ba)TiO_3$, $SrZrO_3$, $In_2Se_3$, $Ca_2Nb_2O_7$, $(Pr,Ca)MnO_3$, $Ta_2O_5$, $NiO_x$ and $TiO_x$, as well as other suitable materials exhibiting two distinct phases of differing resistivities. Chalcogenide materials suitable for use with the present invention include, but are not limited to, tellurium (Te), selenium (Se), germanium (Ge), antimony (Sb), bismuth (Bi), lead (Pb), tin (Sn), arsenic (As), sulfur (S), silicon (Si), phosphorus (P), any mixture thereof, and/or any alloy thereof. In a preferred embodiment of the invention, PCM layer 120 comprises GST. PCM layer 120 may be deposited on at least a portion of one or more surfaces of the storage element using a standard deposition process (e.g., sputtering, spraying, chemical vapor deposition (CVD), etc.), although the invention is not limited to forming the PCM layer in this manner.

Storing data in memory cell 100 preferably involves placing some portion of the total volume of PCM layer 120, referred to herein as the "switchable volume" 106, into either a lower electrical resistance polycrystalline state or a higher electrical resistance amorphous state. Transitions between these states are accomplished primarily by heating the switchable volume 106 of PCM layer 120, for example by applying a pulse of switching current to the memory cell through the bottom and top electrodes 101, 108. The duration of the switching current pulse is preferably between about one and 500 nanoseconds (ns) and has a fast falling edge (e.g., less than about 10 ns), although the invention is not limited to any particular duration and/or rise or fall time of the switching current pulse. The fast falling edge acts to freeze the switchable volume 106 of PCM layer 120 in its electrical resistance state without allowing additional time for the bonds within the material to continue to rearrange.

Subsequently, reading the state of memory cell 100 can be accomplished by applying a sensing voltage to the memory cell, again via the bottom and top electrodes 101, 108. The ratio of the electrical resistances between the higher and lower electrical resistance states in a typical PCM-based memory cell is between about 100:1 and about 1000:1. The sensing voltage is preferably of low enough magnitude to provide negligible ohmic heating in PCM layer 120. Accordingly, the electrical resistance state of PCM layer 120 can be determined in this manner without disturbing its written electrical resistance state. Data integrity is thereby maintained while reading the data.

As previously stated, an embodiment of the invention may also include conductive barrier layer 107 between top electrode 108 and storage element 109. Conductive barrier layer 107, when used, preferably prevents or substantially inhibits a chemical reaction between PCM layer 120 and top electrode 108. Conductive barrier layer 107 is ideally comprised of an electrically conductive material which is substantially inert at least with respect to the materials of which top electrode 108 and PCM layer 120 are comprised. Examples of such electrically conductive but chemically inert materials include, but are not limited to, cobalt, ruthenium, tantalum, tantalum nitride (TaN), indium oxide, and titanium nitride (TiN). In a preferred embodiment of the invention where top electrode 108 comprises copper and PCM layer 120 comprises GST, conductive barrier layer 107 preferably comprises TiN or TaN. Both TiN and TaN exhibit a low diffusion rate for metallic elements. As a result, forming conductive barrier layer 107 out of these materials substantially prevents metallic elements contained in top electrode 108 from diffusing into PCM layer 120.

Insulating layer 102 is preferably formed of an oxide, nitride, or an alternative material which is substantially electrically non-conductive (e.g., having a resistance in the gigohm range). Insulating layer 102 may be formed using, for example, a standard oxide growth process, although alternative methodologies for forming the insulating layer are similarly contemplated (e.g., deposition process). The material used to form insulating layer 102 should be stable at temperatures higher than a melting point of the PCM in PCM layer 120 at the set and reset temperatures, which may be greater than about 500 degrees Celsius, so that compounds do not form between the PCM and the insulating layer material during operation of the storage element 109. Additionally, insulating layer 102 and PCM layer 120 should be mutually insoluble so as to further reduce the likelihood that compounds form between the PCM layer and the insulating layer.

A cross-sectional thickness, d, of insulating layer 102 is preferably about 10 nm to about 100 nm, although the invention is not limited to any particular thickness. In a preferred embodiment, insulating layer 102 comprises silicon dioxide or silicon nitride.

With continued reference to FIG. 1, storage element 109 includes a pillar 104 traversing insulating layer 102 and in electrical contact with bottom electrode 101. Pillar 104 preferably comprises a heater 103, formed on an upper surface of bottom electrode 101, and a collar 105 formed on at least a portion of an upper surface of the heater. A cross-sectional thickness of heater 103 (measured as a height of the heater above the bottom electrode) is preferably less than a cross-sectional thickness of the insulating layer 102, such that a recess is formed in the insulating layer. Collar 105 is formed on sidewalls of the recess in insulating layer 102. An extension of PCM layer 120 (e.g., switchable volume 106) is formed on an upper surface of collar 105.

Pillar 104 is preferably substantially circular in a horizontal plane parallel to a plane defined by the interface between the pillar and lower electrode 101 (i.e., when the pillar is viewed top down). Such a shape may, for example, be advantageous with respect to a packing density of a plurality of such memory cells in an integrated circuit. In this instance, collar 105 is preferably shaped substantially as a toroid (e.g., doughnut). Nevertheless, other shapes for the pillar 104 and collar 105 (and the resultant recess in the insulating layer) are similarly contemplated and would still come within the scope of the invention. Pillar 104 could be, for instance, elliptical or rectangular in the horizontal plane defined above. These and other shapes may allow the switchable volume 106 of the PCM in PCM layer 120 to be beneficially increased without concomitantly causing the current density to be substantially reduced at any point within the switchable volume during application of the switching current pulse.

As apparent from the figure, collar 105 preferably creates a constriction for reducing the volume 106 of PCM in PCM layer 120 which is in contact with heater 103. In this manner, collar 105 is configured to constrict a flow of current in at least a portion of PCM layer 120 proximate heater 103 to thereby create a region of localized heating in at least a portion of the PCM layer when a switching current signal is applied between the top and bottom electrodes 108, 101. Collar 105 preferably comprises a dielectric (e.g., an oxide, nitride, etc.), or an alternative material which is substantially electrically non-conductive (e.g., having a resistance in the gigohm range).

Heater 103 is preferably comprised of an electrically conductive material which is substantially chemically inert when in contact with materials used to form PCM layer 120, insulating layer 102, bottom electrode 101, and collar 105. Examples of such electrically conductive but chemically inert materials include carbon, TiN, and TaN, although the invention is not limited to these materials. In a preferred embodiment where PCM layer 120 comprises GST, heater 103 preferably comprises TiN. When a signal is applied to the bottom and top electrodes 101, 108 of memory cell 100, a volume 106 of PCM layer 120 proximate to heater 103, which is substantially more conductive than the surrounding insulating layer 102, will experience a current density which is substantially higher compared to a current density in the remainder of the PCM as a result of the constriction created, at least in part, by collar 105. The concentration of current in and around pillar 104 will, in turn, result in localized self-heating of the PCM. When the applied signal reaches a certain threshold so as to cause a localized heating of the PCM proximate to heater 103 to a certain critical temperature value, a phase transition of at least a portion of the PCM will occur.

Advantageously, these unique design features act to force the switching current to pass through a confined volume 106 of the PCM in PCM layer 120. As a result, this memory cell design provides high localized switching current density so that the magnitude of the switching current pulse can be reduced to a value that is compatible with modern integrated circuits.

The confinement of the switching current to the narrow switching volume 106 of the PCM which is in direct contact with the heater (e.g., within the pillar and within the collar) results in a high localized current density in this volume, and, in turn, high ohmic heating. For this reason, this volume forms the switchable volume 106 of the PCM layer 120 in the memory cell 100. Outside of this switchable volume, the current density is insufficient to cause the transition between electrical resistance states. Accordingly, the switching current needed to effect an electrical resistance state change in the memory cell will largely be determined by the narrow volume of the PCM that forms part of the periphery of the recess in insulating layer 102. The magnitude of this required switching current pulse will be substantially less than that which would be required to cause a state transition in the remainder of the PCM volume.

Moreover, in addition to restricting the switchable volume 106 of the PCM in PCM layer 120 to that region defined by collar 105, heater 103 and insulating layer 102, memory cell 100 also acts to thermally isolate this switchable volume. Reference to FIG. 1 shows that the non-switching portion of the PCM is located above the switchable volume 106 of the PCM, while dielectric material in the form of collar 105 and insulating layer 102 surround the switchable volume laterally. Since PCMs such as GST and insulating materials such as silicon dioxide and silicon nitride have relatively low thermal conductivities when compared to conductive materials (e.g., metals), this arrangement tends to trap heat within the switchable volume. Advantageously, this thermal isolation causes the heating efficiency of this switchable volume to be increased, again allowing the magnitude of the switching current pulse to be reduced.

Figure 2:
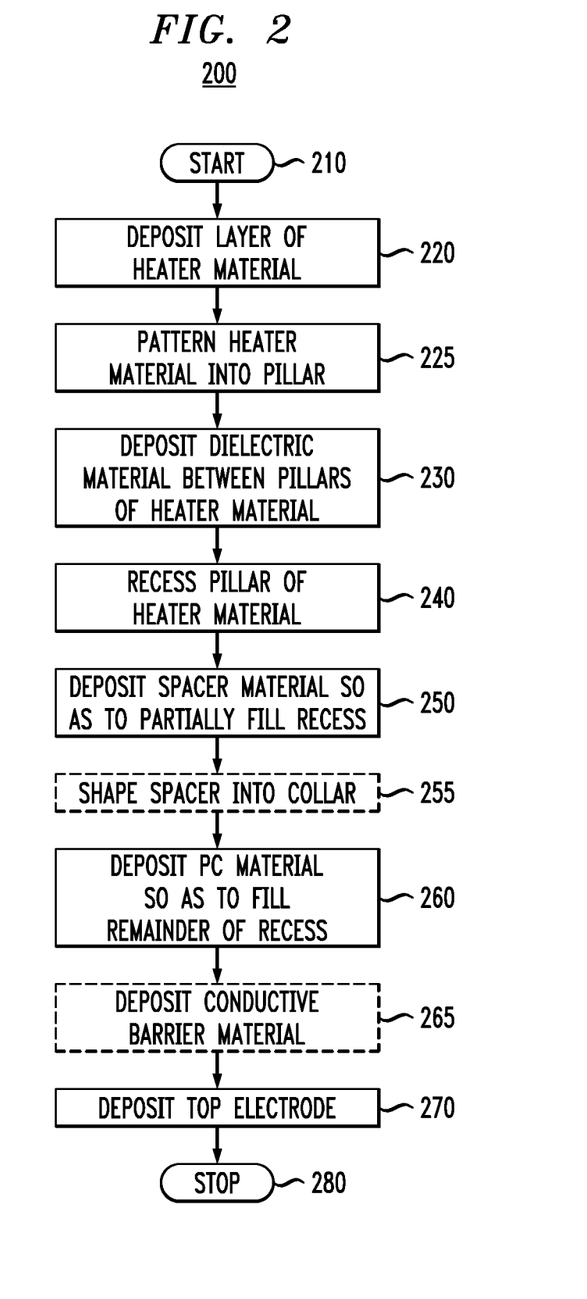
FIG. 2 is a simplified flow diagram showing an exemplary method for forming a memory cell in accordance with an aspect of the present invention.

FIG. 2 is a simplified flow diagram showing an exemplary method 200 for forming a memory cell, in accordance with an aspect of the present invention. FIGS. 3-8 are cross-sectional views depicting illustrative steps in a semiconductor fabrication process which may be used in forming a memory cell of the type shown in FIG. 1, in accordance with an embodiment of the invention. This fabrication process comprises the deposition of several layers upon a semiconductor substrate; this deposition may be accomplished using a variety of deposition techniques known to those skilled in the art, including but not limited to physical vapor deposition (PVD), chemical vapor deposition (CVD), electrochemical deposition (ECD), molecular beam epitaxy (MBE), atomic layer deposition (ALD), etc.

Figure 3:
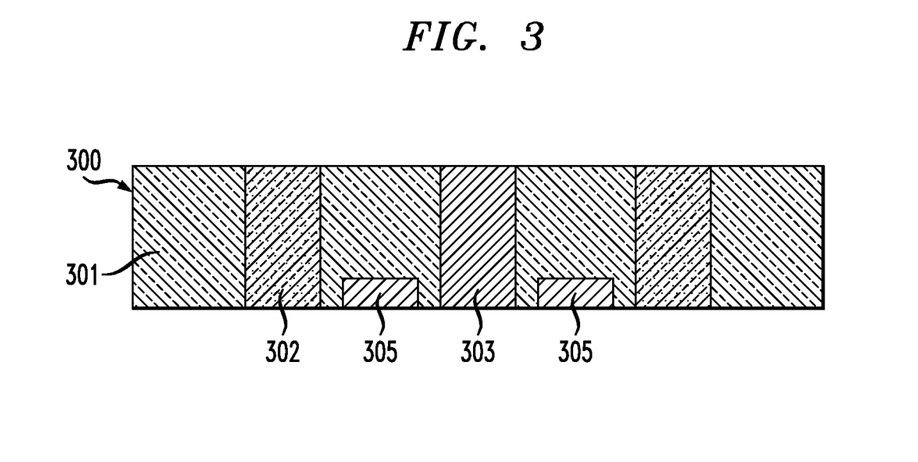
FIGS. 3-8 show cross-sectional views of the illustrative memory cell depicted in FIG. 1 during various stages of formation under the exemplary method of FIG. 2, in accordance with an embodiment of the invention.
Figure 4:
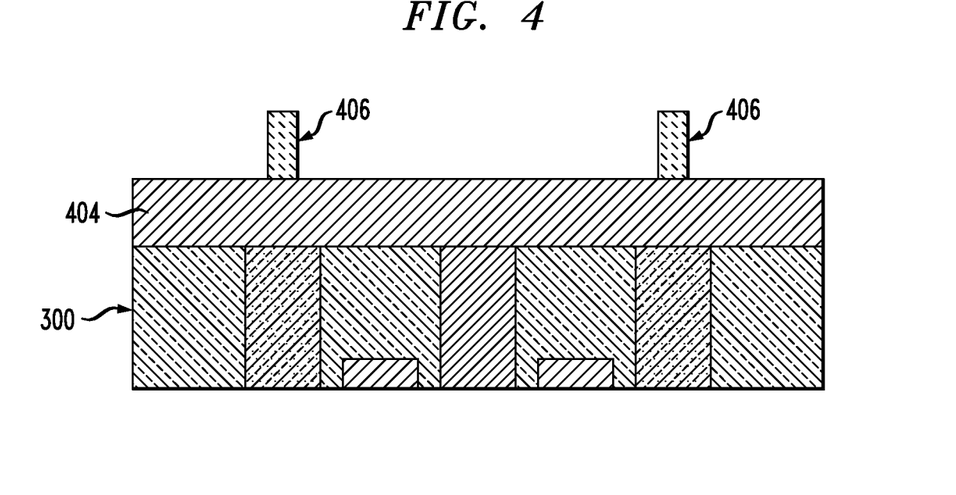

With reference first to FIG. 2, the method 200 begins in 210 with, for example, a semiconductor structure 300 such as that shown in FIG. 3. This exemplary middle-of-the-line structure 300 may comprise a first insulating layer 301, at least one electrode 302 (which may correspond to bottom electrode 101 shown in FIG. 1), a first conductor 303, which may be a bit line, and a second conductor 305, which may be a word line. Electrode 302, as well as first and second conductors 303, 305, preferably comprise a metal or an alternative conductive material (e.g., polysilicon). Electrode 302, first and second conductors 303, 305 need not be formed of the same material. The word line preferably serves to bias one or more FETs devices (omitted from the drawings for clarity), each FET device being used to selectively access a corresponding memory cell. This represents a starting point of the portion of the semiconductor fabrication process described herein.

This particular arrangement is merely illustrative and a number of other arrangements would still come within the scope of the invention. For example, rather than being formed of a metal, electrode 302 may be a metal contact (e.g., a stud) on which the memory cell is formed. This metal contact could, for example, be operative to electrically connect the memory cell to a FET that resides at a different level in the integrated circuit. These and other variations on the placement of the memory cell within the metallization of an integrated circuit will be familiar to one skilled in the art.

Figure 5:
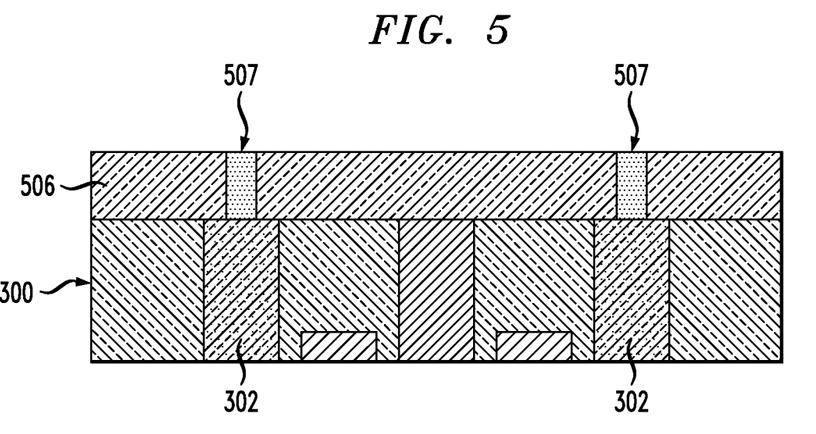

In step 220, a conductive layer (e.g., conductive layer 404 shown in FIG. 4) to be used for the heater (e.g., heater 103 shown in FIG. 1) is deposited on an upper surface of semiconductor structure 300. Next, in step 225, this layer of heater material is patterned to form one or more pillars using fabrication methods known to persons having skill in the art. For example, conventional photolithography may be utilized to form a photoresist masking feature 406, or alternative protective layer or film, on an upper surface of conductive layer 404 in which the desired pillar is to be formed, resulting in the film stack shown in FIG. 4. With this photoresist masking feature 406 in place, an anisotropic etching technique, preferably reactive ion etching (RIE), is used to remove portions of the conductive layer 404 where photoresist masking feature 406 is not present. Once the anisotropic etching process is complete, the photoresist masking feature 406 is stripped from the upper surface of conductive layer 404, leaving one or more pillars 507, each pillar being formed on an upper surface of a corresponding electrode 302, as shown in FIG. 5. Pillar 507 may correspond to pillar 104 depicted in FIG. 1.

It should be noted that modern semiconductor processing techniques allow a pillar (e.g., pillar 507 in FIG. 5) to optionally be formed with a width substantially smaller than the photoresist masking feature (e.g., photoresist masking feature 406 in FIG. 4) utilized to define the pillar. For example, the RIE processing step that patterns the pillar can be made to have a substantial "etch bias" that narrows the feature being etched in relation to the size of the photoresist masking feature. Additionally, or alternatively, after RIE, the pillar can be exposed to a timed wet etch, or alternative etching process, to reduce the size of the pillar. Hydrofluoric acid, for example, can be utilized to precisely etch features comprising silicon dioxide. Hot phosphoric acid may, alternatively, be utilized to etch features comprising silicon nitride. FIG. 5 illustrates the result of these steps.

It should be noted that although fabrication method 200 is described herein as using photolithography for patterning the conductive layer (404 in FIG. 4) which will form the heater in a corresponding memory cell, any patterning process may be utilized to form the pillars (406 in FIG. 4), as will be appreciated by one having skill in the art. Furthermore, it should be noted that an alternative patterning process may not require the use of a photoresist masking feature 406.

After the pillar has been formed, in step 230 an insulating layer (insulating layer 506 in FIG. 5), which may correspond to insulating layer 102 depicted in FIG. 1, is preferably formed on an upper surface of semiconductor structure 300 and surrounding pillars 507, so as to substantially fill the gaps between the pillars. Insulating layer 506 may be formed, for example, using a deposition process as discussed above or an oxide growth process, although alternative methods for forming the insulating layer are similarly contemplated, as will be known by those skilled in the art. A polishing step (e.g., chemical mechanical polishing (CMP)) may also be performed such that insulating layer 506 is substantially planar with the pillars 507. FIG. 5 illustrates result of these steps.

Figure 6:
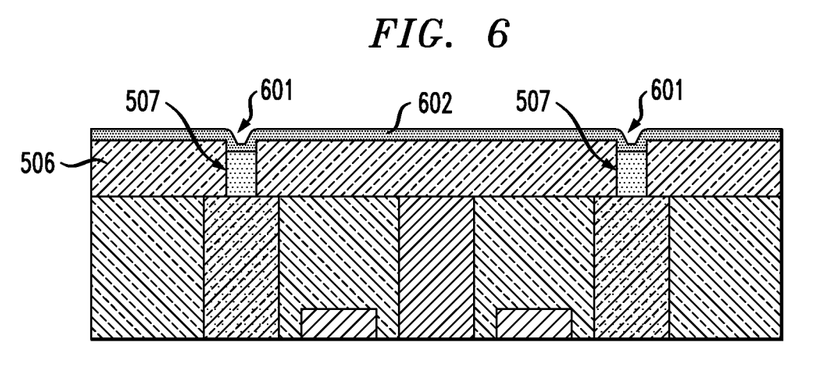

Next, in step 240 a recess 601 is formed in each pillar 507 such that an upper surface of the pillars is below an upper surface of insulating layer 506, as depicted in FIG. 6. Recess 601 may be formed, for example, using a process which can obtain a smaller diameter than is possible using conventional photolithography. This may be accompanied by RIE using a plasma which will etch pillar 507 but not insulating 506. In a preferred embodiment of the invention in which the pillar 507 comprises TiN and the insulating layer 506 comprises silicon dioxide, a combination of flouroform ($CHF_3$) and chlorine ($Cl_2$) within an argon diluent (Ar) satisfies these properties. Next, in step 250 a conformal spacer layer 602 is substantially uniformly deposited on an upper surface of the structure, including upper surfaces of insulating layer 506 and pillars 507. FIG. 6 illustrates results of these steps.

Figure 7:
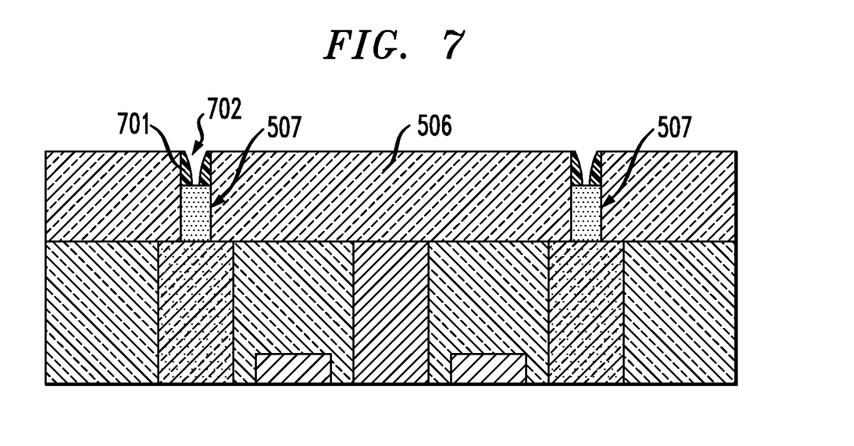
Figure 8:
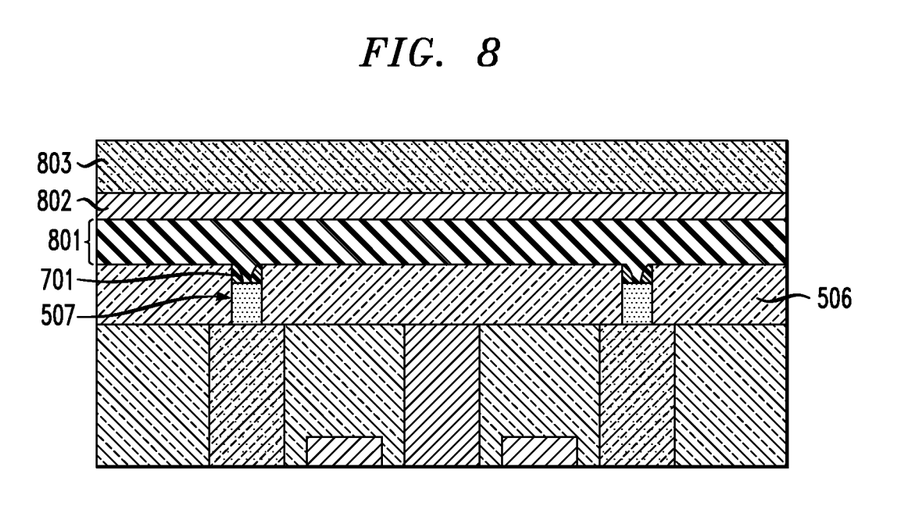

In step 255, an anisotropic etching process (e.g., directional RIE) may be used to remove portions of the conformal spacer layer 602 on upper surfaces of insulating layer 506 and pillars 507, thereby at least partially exposing the pillars, as shown in FIG. 7. By using anisotropic etching, portions of the conformal spacer layer (e.g., 602 in FIG. 6) will remain on sidewalls of the insulating layer defining the recess (e.g., recess 601 in FIG. 6). In this manner, the conformal spacer layer will form a collar 701 on sidewalls of the recess. The collar 701 further constricts a volume 702 within the recess of the pillar 507. FIG. 7 shows results of this step.

In step 260, a PCM layer (e.g., PCM layer 801 shown in FIG. 8), which may correspond to PCM layer 120 in FIG. 1, is formed on an upper surface of insulating layer 506 and filling the volume 702 (see FIG. 7) in the recess defined by the upper surface of pillar 507 and collar 701. The PCM filling volume 702 preferably corresponds to the switchable volume in PCM layer 801, as described above. In step 265, a barrier layer 802, which may correspond to conductive barrier 107 depicted in FIG. 1, may be optionally deposited on an upper surface of PCM layer 801. Finally, in step 270 a top electrode layer 803, which may correspond to top electrode 108 in FIG. 1, is formed on an upper surface of barrier layer 802, for example by deposition, photolithography and RIE or, in a preferred embodiment in which the top electrode layer is copper, by a damascene process (e.g., patterning of silicon dioxide, copper deposition and CMP). The method ends at 280.

Figure 9:
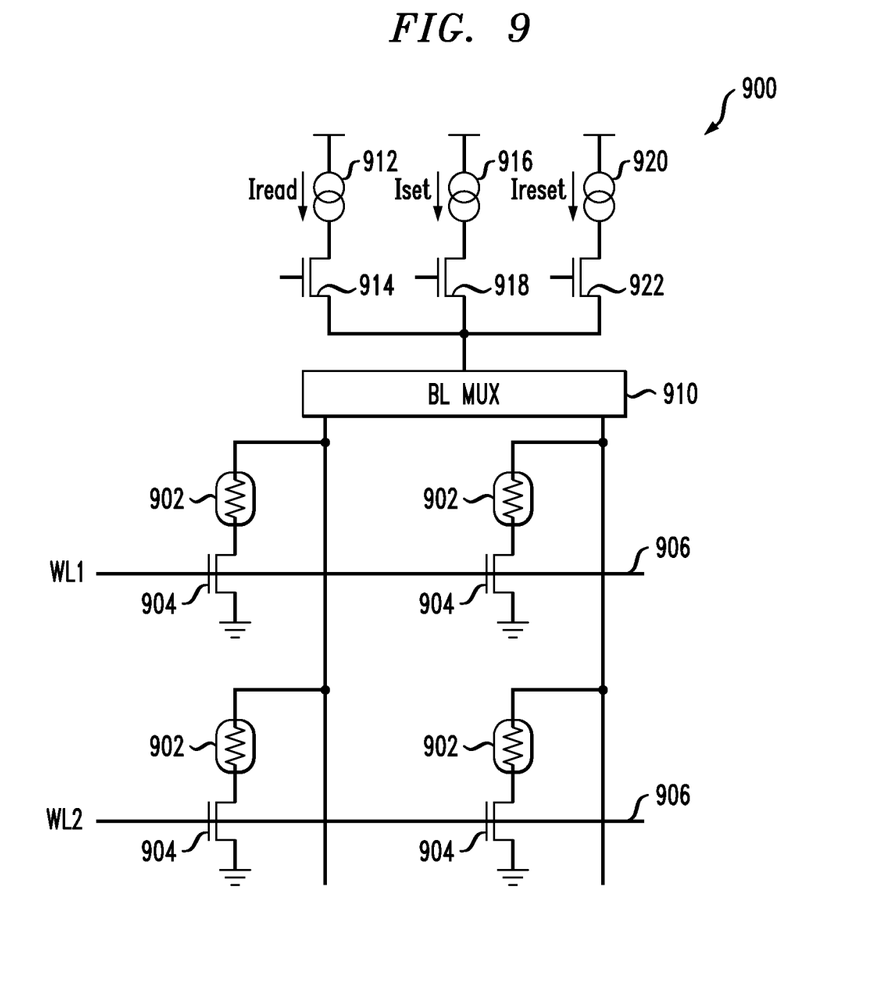
FIG. 9 is a schematic diagram illustrating an exemplary nonvolatile memory circuit in which the memory cell of the present invention can be employed, in accordance with another aspect of the invention.

FIG. 9 is a schematic diagram illustrating an exemplary nonvolatile memory circuit 900 in which the memory cell of the present invention can be employed, in accordance with another aspect of the present invention. The memory circuit 900 preferably comprises a plurality of PCM-based memory cells 902, at least a subset of which are formed in accordance with techniques of the invention described above, and corresponding access transistors 904 connected thereto. Access transistors 904 are selectively activated by application of appropriate signals, WL1, WL2, to corresponding word lines 906 in the memory circuit 900. Each of the access transistors 904 is preferably operative to connect a first electrode of the corresponding memory cell 902 to ground, or an alternative voltage source.

Memory circuit 900 further includes a plurality of current sources 912, 916 and 920, supplying currents Iread, Iset and Ireset, respectively, to the memory cells 902 via a bit line multiplexer (BL mux) 910, or an alternative switching arrangement. Each of the current sources 912, 916, 920 is preferably connected to the multiplexer 910 through a corresponding switch, 914, 918 and 922, respectively, which may comprise a transistor as shown. The current Iread is preferably configured for selectively reading a logical state of the memory cells 902, while the currents Iset and Ireset are preferably configured for performing a set and reset operation, respectively, for selectively writing a logical state of the cells.

At least a portion of the methodologies of the present invention may be implemented in an integrated circuit. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A semiconductor structure configurable for use as a nonvolatile storage element, the semiconductor structure comprising:
    a first electrode;
    an insulating layer formed on at least a portion of an upper surface of the first electrode;
    a pillar traversing the insulating layer and being recessed relative to an upper surface of the insulating layer, the pillar comprising a heater formed on at least a portion of the upper surface of the first electrode, and a collar formed on sidewalls of the insulating layer proximate the heater and on at least a portion of an upper surface of the heater, a lower surface of the collar being formed entirely on the at least a portion of the upper surface of the heater, wherein the heater is formed of carbon or titanium nitride or tantalum nitride, and wherein the beater has a width that is less than a width of the first electrode;
    as phase change material layer formed on at least a portion of the upper surface of the insulating layer and tilling a volume defined by the upper surface of the heater and an upper surface of the collar, at least a portion of the phase change material being in physical contact with the carbon or titanium nitride or tantalum nitride material forming the upper surface of the heater; and
    at least a second electrode formed on at least a portion of an upper surface of the phase change material layer,
    wherein the collar is configured so as to concentrate a flow of current from the phase change material layer formed on the upper surface of the insulating layer to within the phase change material filling said defined volume and cause a state transition of substantially all of the phase change material filling said defined volume due to localized heating, when a switching current signal is applied between the first and second electrodes.

2. The structure of claim 1, further comprising a conductive barrier layer formed between the second electrode and the phase change material layer.

3. The structure of claim 2, wherein the conductive barrier layer comprises an electrical conductive material that is substantially inert with respect to materials used to form at least one of the phase change material layer and the second electrode.

4. The structure of claim 1, wherein the phase change material layer comprises at least one of a chalcogenide material and a transition metal oxide.

5. The structure of claim 1, wherein the material that forms the heater is substantially chemically inert when in contact with materials used to form at least one of the phase change material layer, the insulating layer, the first electrode and the collar.

6. The structure of claim 1, wherein the collar is shaped substantially as a toroid.

7. An integrated circuit including at least one semiconductor structure, the at least one semiconductor structure comprising:
a first electrode;
an insulating layer formed on at least a portion of an upper surface of the first electrode;
a pillar traversing the insulating layer and being recessed relative to an upper surface of the insulating layer, the pillar comprising a heater formed on at least a portion of the upper surface of the first electrode and a collar formed on sidewalls of the insulating layer proximate the heater and on at least a portion of an upper surface of the heater, wherein the heater is formed of carbon or titanium nitride or tantalum nitride, and wherein the heater has a width that is less than a width of the first electrode;
a phase change material layer formed on at least a portion of the upper surface of the insulating layer and filling a volume defined by the upper surface of the heater and an upper surface of the collar, at least a portion of the phase change material being in physical contact with the carbon or titanium nitride or tantalum nitride material forming the upper surface of the heater; and
at least a second electrode farmed on at least a portion of an upper surface of the phase change material layer,
wherein the collar is configured so as to concentrate a flow of current from the phase change material layer formed on the upper surface of the insulating layer to within the phase change material filling said defined volume and cause a state transition of substantially all of the phase change material filling said defined volume due to localized heating, when a switching current signal is applied between the first and second electrodes.

8. A memory circuit, comprising:
a plurality of nonvolatile memory cells; and
a plurality of bit lines and word lines operatively coupled to the memory cells for selectively accessing one or more of the memory cells;
wherein at least a given one of the memory cells comprises:
a first electrode;
an insulating layer formed on at least a portion of an upper surface of the first electrode;
a pillar traversing the insulating layer and being recessed relative to an upper surface of the insulating layer, the pillar comprising as heater farmed on at least a portion of the upper surface of the first electrode and a collar formed on sidewalls of the insulating layer proximate the heater and on at least a portion of an upper surface of the heater, a lower surface of the collar being formed entirely on the at least a portion of the upper surface of the heater, wherein the heater is formed of carbon or titanium nitride or tantalum nitride, and wherein the heater has a width that is less than a width of the first electrode;
a phase change material layer formed on at least as portion of the upper surface of the insulating layer and filling a volume defined by the upper surface of the heater and an upper surface of the collar, at least a portion of the phase change material being in physical contact with the carbon or titanium nitride or tantalum nitride material forming the upper surface of the heater and the upper surface of the collar; and
at least a second electrode formed on at least a portion of an upper surface of the phase change material layer,
wherein the collar is configured so as to concentrate a flow of current from the phase change material layer finned on the upper surface of the insulating layer to within the phase change material filling said defined volume and cause a state transition of substantially all of the phase change material tilling said defined volume due to localized heating, when a switching current signal is applied between the first and second electrodes.

9. The circuit of claim 8, wherein the material that forms the heater is substantially chemically inert when in contact with materials used to form at least one of the phase change material layer, the insulating layer, the first electrode and the collar.

10. The circuit of claim 8, wherein the given memory cell further comprises a conductive barrier layer formed between the second electrode and the phase change material layer.

11. A method of forming a semiconductor structure configurable for use as a nonvolatile storage element, the method comprising the steps of:
forming a first electrode;
forming an insulating layer on at least a portion of an upper surface of the first electrode;
forming a pillar traversing the insulating layer and being recessed relative to an upper surface of the insulating layer, the pillar comprising a heater formed on at least a portion of the upper surface of the first electrode and a collar formed on sidewalls of the insulating layer proximate the heater and on at least a portion of an upper surface of the heater, a lower surface of the collar being formed entirely on the at least a portion of the upper surface of the heater, wherein the beater is formed of carbon or titanium nitride or tantalum nitride, and wherein the heater has a width that is less than a width of the first electrode;
forming a phase change material layer on at least a portion of the upper surface of the insulating layer and filling a volume defined by the upper surface of the heater and an upper surface of the collar, at least a portion of the phase change material being in physical contact with the carbon or titanium nitride or tantalum nitride material forming the upper surface of the heater and the upper surface of the collar; and
forming at least a second electrode on at least a portion of an upper surface of the phase change material layer,
wherein the collar is configured so as to concentrate a flow of current from the phase change material layer formed on the upper surface of the insulating layer to within the phase change material filling said defined volume and cause a state transition of substantially all of the phase change material tilling said defined volume due to localized heating, when a switching current signal is applied between the first and second electrodes.

12. The method of claim 11, further comprising the step of forming a conductive barrier layer between the second electrode and the phase change material layer.

13. The method of claim 11, wherein the material that forms the heater is substantially chemically inert when in contact with materials used to form at least one of the phase change material layer, the insulating layer, the first electrode and the collar.

* * * * *